(12) United States Patent
Hauser et al.

(10) Patent No.: US 7,284,321 B2
(45) Date of Patent: Oct. 23, 2007

(54) METHOD FOR TESTING A CHIP WITH A PACKAGE AND FOR MOUNTING THE PACKAGE ON A BOARD

(75) Inventors: Wolfgang Hauser, Endlingen (DE); Heiko Dreher, Winden (DE); Christian Kimstedt, Freiburg (DE); Markus Rogalla, Bad Korzingen (DE)

(73) Assignee: Micronas GmbH, Freiburg (DE)

( * ) Notice: Subject to any disclaimer, the term of this patent is extended or adjusted under 35 U.S.C. 154(b) by 102 days.

(21) Appl. No.: 11/130,709

(22) Filed: May 17, 2005

(65) Prior Publication Data

US 2005/0258849 A1 Nov. 24, 2005

Related U.S. Application Data

(62) Division of application No. 10/485,139, filed on Sep. 2, 2004, now Pat. No. 7,053,480.

(51) Int. Cl.
*H05K 3/30* (2006.01)
(52) U.S. Cl. .............. 29/838; 29/837; 29/874; 29/882; 29/884
(58) Field of Classification Search .......... 29/837, 29/838, 827, 874, 882, 884
See application file for complete search history.

(56) References Cited

U.S. PATENT DOCUMENTS 3,441,853 A * 4/1969 Bodine .................. 324/537
3,550,238 A * 12/1970 Allen et al. ................ 227/2
3,564,691 A * 2/1971 Ackerman ............... 227/116
3,573,617 A * 4/1971 Randolph et al. .......... 324/755
3,688,393 A * 9/1972 Halstead ................... 29/827
3,701,077 A * 10/1972 Kelly, Jr. ................... 439/70
4,293,998 A * 10/1981 Kawa et al. ............. 29/564.1
4,367,584 A * 1/1983 Janisiewicz et al. ....... 29/837
4,498,047 A * 2/1985 Hexamer et al. .......... 324/754

* cited by examiner

*Primary Examiner*—Carl J. Arbes
(74) *Attorney, Agent, or Firm*—O'Shea, Getz & Kosakowski, P.C.

(57) ABSTRACT

A method for testing a chip with a package having connecting pins and mounting the package on a board combines the advantages of a package with inline connecting pins with that of a package with offset connecting pins. The package with inline connecting is inserted into a socket for testing. Before mounting on the board, at least one connecting pin, preferably every second connecting pin, of the package is bent inward by a bending tool to achieve an offset arrangement of the connecting pins. The package is preferably mounted on the board using the bending tool. Since every second connecting pin is not bent inward immediately before insertion of the connecting pins, no subsequent corrective alignment of the offset connecting pins is required.

19 Claims, 5 Drawing Sheets

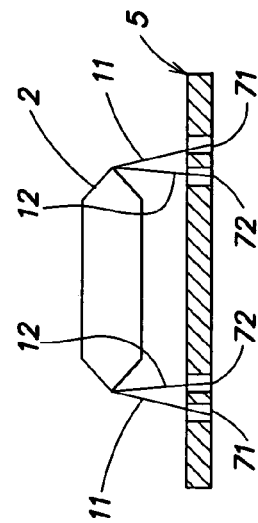
FIG. 1B
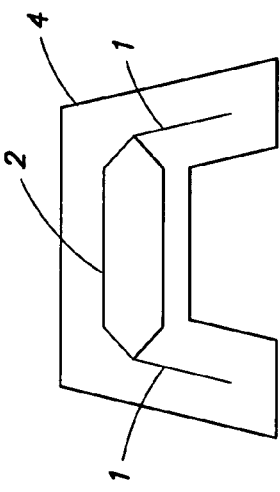
FIG. 1C
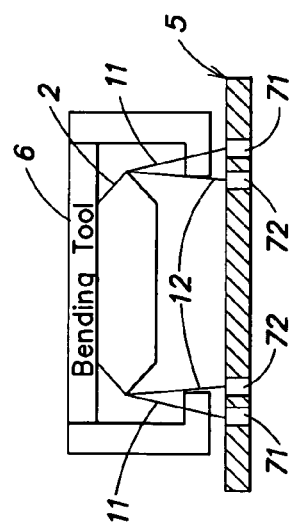
FIG. 1D
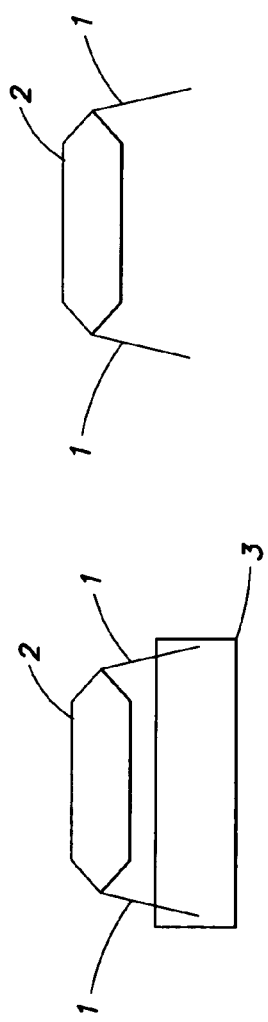
FIG. 1E
FIG. 1F

METHOD FOR TESTING A CHIP WITH A PACKAGE AND FOR MOUNTING THE PACKAGE ON A BOARD

CROSS REFERENCE TO RELATED APPLICATION

This application is a divisional of application Ser. No. 10/485,139 filed Sep. 2, 2004 now U.S. Pat. No. 7,053,480 entitled "METHOD FOR TESTING A CHIP WITH A PACKAGE AND FOR MOUNTING THE PACKAGE ON A BOARD".

BACKGROUND OF THE INVENTION

The invention relates to the field of semiconductor packaging and testing, and in particular to mounting an integrated circuit that has been tested on a board, wherein the adjacent connecting pins of the integrated circuit are in an inline arrangement.

In order to keep the dimensions small for the package of a chip with multiple connecting pins (e.g., 88 pins), the connecting pins are arranged in line as close as possible. However, a minimum spacing must still be maintained since the space between associated holes on a board for insertion of the connecting pins may not be arbitrarily reduced. As the spacing of the holes and conducting lines on the board becomes closer, the process of fabricating a board becomes more complex and expensive. In addition, there is the risk that close spacing of the holes on the board will cause the connecting pins to short out during the soldering process.

One technique for increasing hole spacing on the board is to configure the connecting pins of the package by bending some of the connecting pins or, for example, by inwardly offsetting every second connecting pin. However, the advantage of greater hole spacing on the board is counteracted by the disadvantages of requiring a special test socket to test the chips and requiring an expensive packaging mechanism. Specifically, the packaging mechanism must be designed such that the connecting pins are not bent out of their precise alignment.

Therefore, there is a need for a method of testing and mounting the package on a board in such a way that simple and inexpensively produced test sockets are sufficient for testing, and similarly simple and inexpensively produced packaging mechanisms are sufficient for packaging, while at the same time achieving an offset arrangement for the connecting pins.

SUMMARY OF THE INVENTION

Briefly, according to an aspect of the invention, an integrated circuit that includes a die mounted within a package containing a plurality of input/output pins is tested by placing the integrated circuit into a test socket of automatic test equipment. Prior to the tested integrated circuit being mounted on a board, a portion of the plurality of input/output pins are bent from their inline position to an offset position.

The integrated circuit with its inline connecting pins is inserted into a test socket for testing. At least one connecting pin is bent inward using a bending tool immediately before insertion of the connecting pins of the integrated circuit into the holes of the board, in order to achieve an offset arrangement of the connecting pins.

The integrated circuit includes inline connecting pins (i.e., individuals skilled in the art frequently use the expression "dual inline"), and the integrated circuit is tested in this state.

The integrated circuit to be tested is inserted into a test socket. A first advantage is that relatively inexpensive test sockets may be utilized to test the chips. A second advantage is that even inexpensive packaging mechanisms are sufficient for storing and transporting the chips. Additionally, at least one connecting pin, preferably every second connecting pin, is bent inward by the bending tool immediately before insertion of the connecting pins of the integrated circuit into the board in order to form an offset arrangement of the connecting pins. The invention thus combines the advantages of a package in which its connecting pins are in an inline arrangement with those of a package in which its connecting pins are in an offset arrangement.

Electrical testing of the chip may thus be of a simple design since inexpensively produced test sockets are sufficient for the task. In addition, standard packaging mechanisms may be employed to package the package. Subsequent alignment of the connecting pins is simplified since the connecting pins are not bent into the offset arrangement until immediately before insertion into the board, rather than at the fabrication stage of the package.

These and other objects, features and advantages of the present invention will become more apparent in light of the following detailed description of preferred embodiments thereof, as illustrated in the accompanying drawings.

BRIEF DESCRIPTION OF THE DRAWINGS

FIGS. 1B-1F are simplified illustrations of the integrated circuit during the steps illustrated in FIG. 1A;

DETAILED DESCRIPTION OF THE INVENTION

Figure 1A:
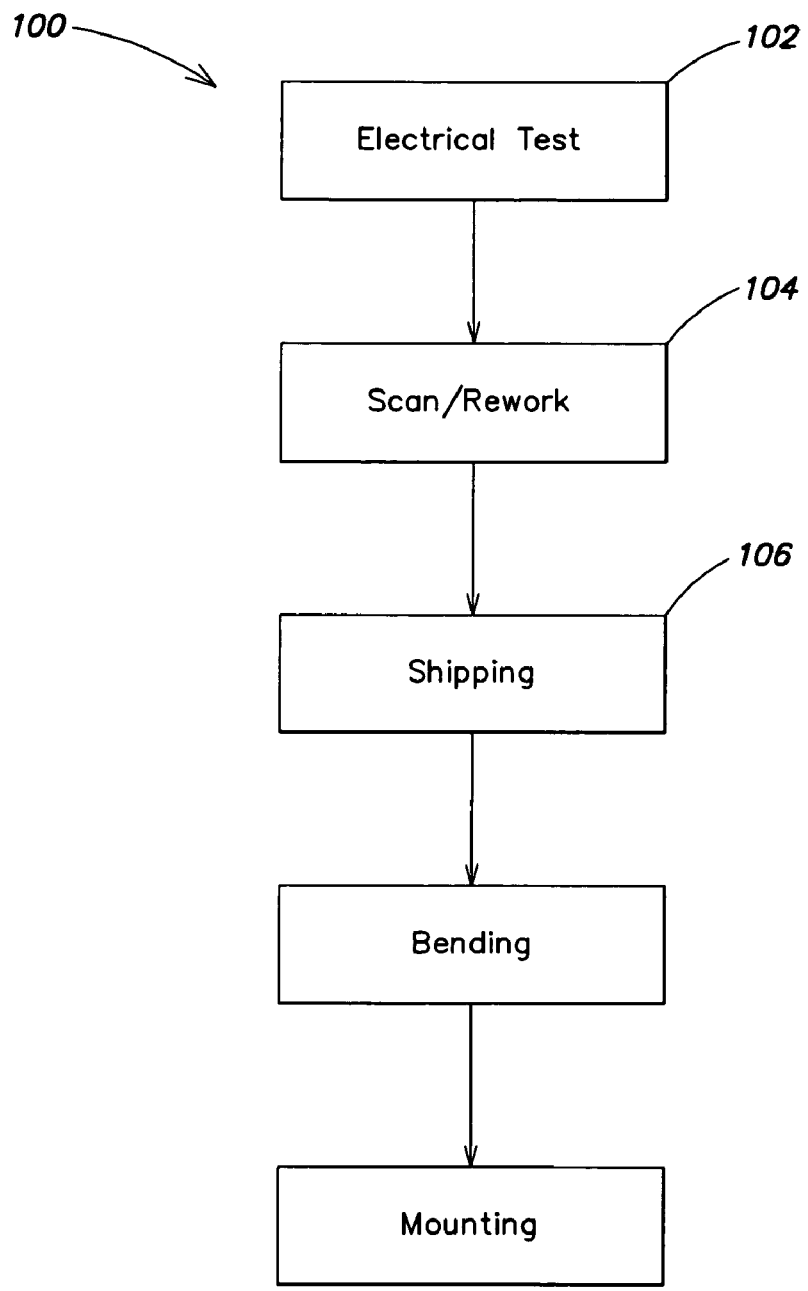
FIG. 1A is a flowchart illustration of a method of testing an integrated circuit and bending selected external input/output pins of the integrated circuit and mounting the integrated circuit with selected external input/output pins bent an angle with respect to the inline position of the pins.

FIG. 1A is a flow chart illustration of a method 100 for testing an integrated circuit, bending the pins of the integrated circuit and mounting the integrated circuit. FIGS. 1B-1F are simplified sectional views of the integrated circuit during the steps illustrated in FIG. 1A.

Referring to FIGS. 1A-1F, in step 102 inline connecting pins 1 of an integrated circuit that includes a die (not shown) and a package 2 containing the die, are input to a test socket 3 as shown in FIG. 1B. In step 104, any rework that may be required on the package 2 or the chip is performed. The package 2 is then placed in a packaging mechanism such as a guide brace 4 and shipped in step 106. Immediately before the package 2 is mounted on a board 5, every second connecting pin 12, for example, is bent inward by a bending tool 6, while the remaining connecting pins 11 are left unmodified. The connecting pins 11 and 12 are inserted into associated holes 71-72 of the board 5, preferably, by the bending tool 6.

Figure 2:
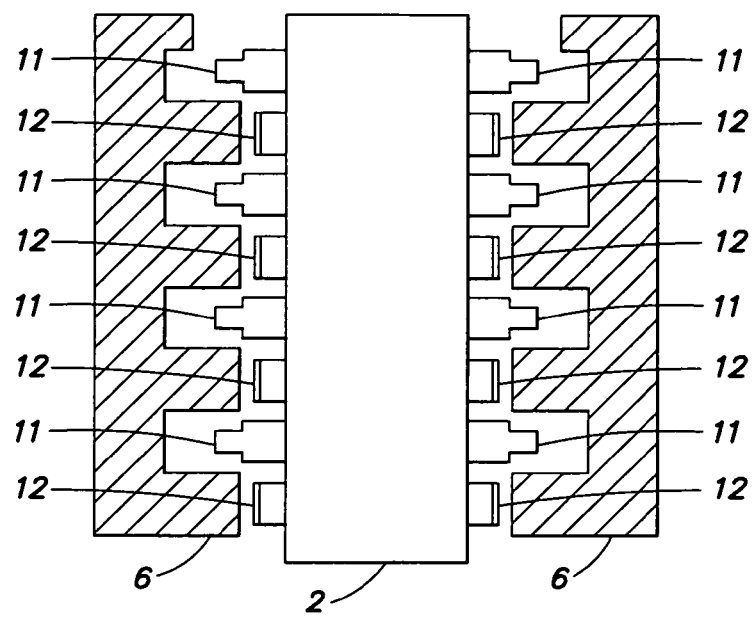
FIG. 2 is a top view illustration of an embodiment of a package with the bending tool attached.

FIG. 2 is a top view illustration of the package 2, along with the connecting pins 11 and 12, and with the bending tool 6 attached.

Figure 3:
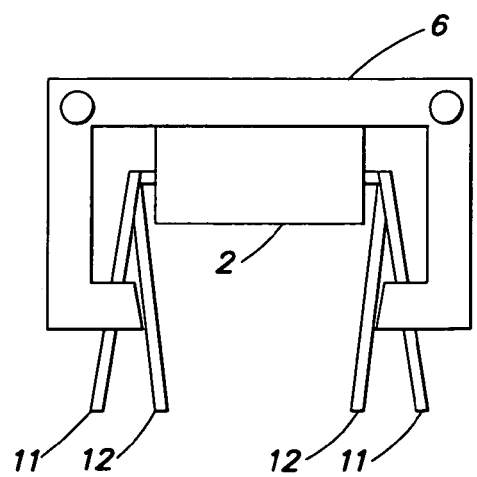
FIG. 3 is a front view illustration of the package of FIG. 2 with the bending tool attached.

FIG. 3 is a front view illustration of the package 2 with the connecting pins 11 and 12, and with the bending tool 6 attached. Every second connecting pin 12 is bent inward, while the remaining connecting pins 11 remain bent outward or are oriented vertically, as is the case during fabrication of the package 2.

Figure 4:
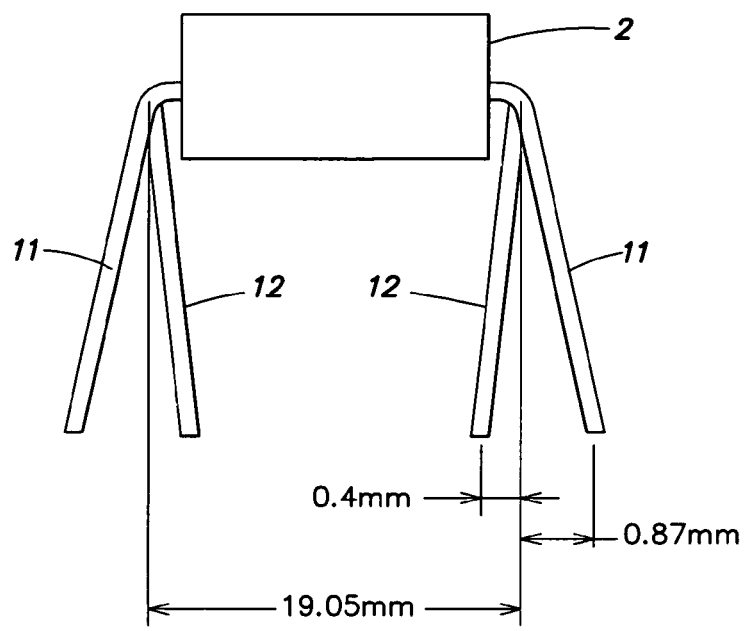
FIG. 4 is a front view illustration of an embodiment of a package.

FIG. 4 is a front view of the package 2, with the first connecting pins 11 bent outward and the second connecting pins 12 bent inward, including dimensional details. The spacing between the vertical pins on the package is 19.05 mm. The second connecting pins 12 are bent 0.4 mm inward from the vertical, while the first or remaining connecting pins 11 are bent 0.87 mm outward.

Figure 5:
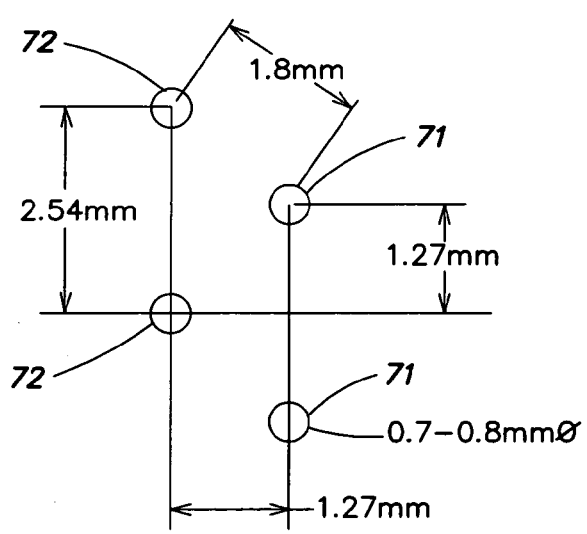
FIG. 5 is a section view of a board having holes for the connecting pins.
Figure 6A:
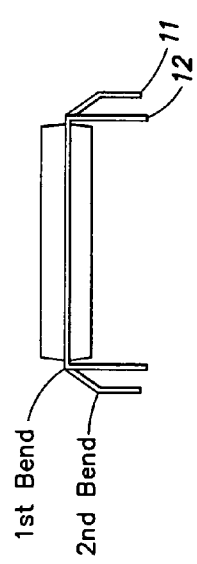
FIGS. 6A-6D illustrate another example of an integrated circuit.
Figure 6B:
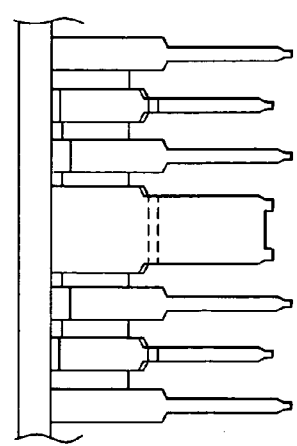
Figure 6C:
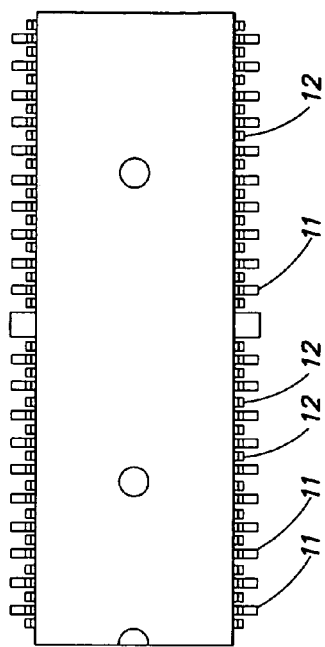
Figure 6D:
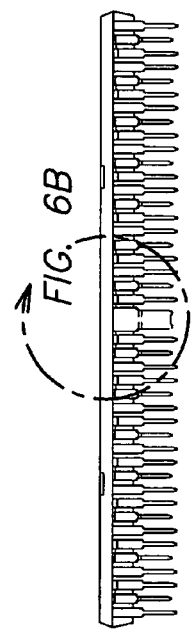

FIG. 5 is a section of the board 5 having first holes 71 for the outwardly bent first connecting pins 11, and second holes 72 for the inwardly bent second connecting pins 12. The first and second holes 71 and 72 are offset relative to each other by 1.27 mm. The spacing of the inline holes 71 and 72 is 2.54 mm. The spacing between two offset holes 71 and 72 is chosen as 1.8 mm.

The connecting pins on the package may be arranged symmetrically relative to the longitudinal center axis and the transverse center axis of the package since this symmetrical arrangement allows for the use of a symmetrical bending tool. It is then irrelevant how the bending tool is placed on the package. It is impossible to bend the connecting pins incorrectly by attaching the bending tool with the improper orientation.

The method according to the invention permits the use of packaging mechanisms suitable for the standard PSDIP package. No special packaging mechanisms are required.

While the above figures describe an approach in which every second connecting pin is bent inward once, FIG. 6 illustrates another possibility. With this possibility, every second pin 12 is bent 90° downward, relative to the package. Every intermediate pin 11, on the other hand, is first bent downward by less than 90° relative to the package, for example, by 45°, then subsequently bent by an additional angle, for example, 45°.

Although the present invention has been shown and described with respect to several preferred embodiments thereof, various changes, omissions and additions to the form and detail thereof, may be made therein, without departing from the spirit and scope of the invention.

What is claimed is:

1. A method for testing an integrated circuit with a package and for mounting the package on a board, where adjacent connecting pins of the package are in an inline arrangement, the method comprising the steps of:
    inserting the package with its inline connecting pins into a test socket to test the integrated circuit; and
    bending inward at least one connecting pin of the package such that the at least one connecting pin is offset with respect to adjacent connecting pins.

2. The method of claim 1, where every second connecting pin is bent inward.

3. The method of claim 2, where the connecting pins are arranged symmetrically relative to a longitudinal center axis of the package and to a transverse center axis of the package.

4. The method of claim 3, where the spacing between the connecting pins is approximately 1.27 mm.

5. The method of claim 3, where the connecting pins are offset relative to each other by approximately 1.27 mm.

6. The method of claim 5, where every first connecting pin is bent outward by a predefined first angle, and every second connecting pin is bent inward by a predefined second angle.

7. The method of claim 6, further comprising the step of mounting the package onto the board by a bending tool.

8. A method for testing an integrated circuit including a package having a plurality of connecting pins, the method comprising the steps of:
    inserting the integrated circuit into a test socket, where the plurality of connecting pins are arranged in a dual-in-line arrangement;
    testing the integrated circuit;
    removing the integrated circuit from the test socket; and
    bending at least one of the connecting pins from its nominal dual-in-line arrangement, such that the at least one connecting pin is offset with respect to adjacent connecting pins of the dual-in-line arrangement.

9. The method of claim 8, where in the step of inserting the integrated circuit into a test socket, the plurality of connecting pins are in two inline non-bent arrangements, where the two arrangements are in parallel with one another.

10. The method of claim 8, where the step of bending comprises bending inward at least one of the connecting pins at an angle from its inline arrangement.

11. The method of claim 8, where the step of bending comprises bending outward at least one of the connecting pins at an angle from its inline arrangement.

12. The method of claim 8, where the step of bending comprises bending at least one of the connecting pins.

13. The method of claim 8, where the step of bending comprises bending every second connecting pin.

14. The method of claim 8, where the step of bending comprises bending every second connecting pin inward at an angle from its inline arrangement.

15. The method of claim 8, where the step of bending comprises bending first alternating connecting pins outward at an angle from its inline arrangement and bending second alternating connecting pins inward at an angle from its inline arrangement.

16. The method of claim 8, where the step of bending comprises bending at least one of the connecting pins to have at least two angles of bending within a length of the pin.

17. A method for mounting an integrated circuit including a package on a printed circuit board, the integrated circuit having a plurality of connecting pins in a dual-in-line arrangement, the method comprising the steps of:
    bending at least one of the connecting pins at an angle from its nominal dual-in-line arrangement, such that the at least one connecting pin is offset with respect to adjacent connecting pins; and
    inserting the connecting pins, including the least one connecting pin and its offset adjacent connecting pins, into corresponding holes of the printed board.

18. The method of claim 17, where the step of bending comprises bending first alternating connecting pins outward at an angle from its inline arrangement and bending second alternating connecting pins inward at an angle from its inline arrangement.

19. The method of claim 17, where the step of bending comprises bending inward at least one of the connecting pins at an angle from its inline arrangement.

* * * * *